United States Patent [19]
Bracke

[11] 4,079,319
[45] Mar. 14, 1978

[54] RADIO FREQUENCY SIGNAL DISTRIBUTION DEVICE FOR USE IN A CATV SYSTEM

[75] Inventor: Lodevicus Petrus M. Bracke, Eindhoven, Netherlands

[73] Assignee: U.S. Philips Corporation, New York, N.Y.

[21] Appl. No.: 760,839

[22] Filed: Jan. 21, 1977

[30] Foreign Application Priority Data
Jan. 29, 1976 Netherlands ............. 7600891

[51] Int. Cl.² ................................ H04H 1/02
[52] U.S. Cl. ....................... 325/308; 333/10
[58] Field of Search ........... 325/308; 333/10, 11, 333/24 R, 84 M; 358/86

[56] References Cited
U.S. PATENT DOCUMENTS

| | | | |
|---|---|---|---|
| 3,164,790 | 1/1965 | Oh | 333/10 |
| 3,372,350 | 3/1968 | Kawahashi et al. | 333/10 |
| 3,460,069 | 8/1969 | Uberbacher et al. | 333/10 |
| 3,535,640 | 10/1970 | Forrest, Jr. | 325/308 |
| 3,747,028 | 7/1973 | Pennypacker | 333/10 |

Primary Examiner—Benedict V. Safourek
Assistant Examiner—Jin F. Ng
Attorney, Agent, or Firm—Frank R. Trifari; Henry I. Steckler

[57] ABSTRACT

Radio frequency signal distribution device for use in a distribution system for VHF and UHF signals, which device comprises an input terminal, an output terminal and a signal transmission line connected between the input terminal and the output terminal, which signal transmission line is provided with a plurality of directional couplers which are connected in series for the radio frequency signal on the signal transmission line, each directional coupler comprising a coupling loop as well as a tap-off terminal which is connected to the coupling loop, which coupling loop has an electrical length of a quarter of the wavelength of a frequency in the TV UHF range, which signal distribution device can supply signals to some dozens of subscribers within a radius of 80 to 100 m which signals satisfy the requirements imposed in practice as regards the signal level within given frequency bands.

4 Claims, 1 Drawing Figure

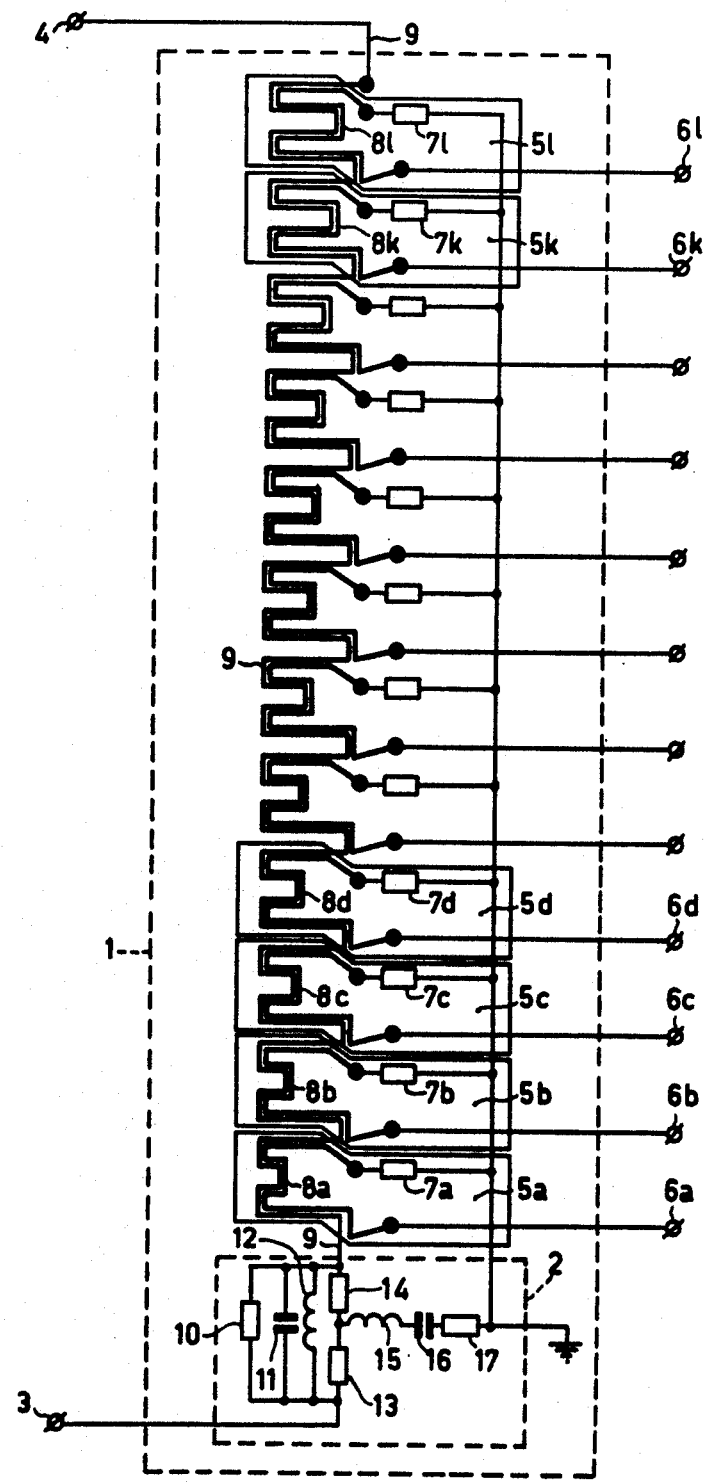

RADIO FREQUENCY SIGNAL DISTRIBUTION DEVICE FOR USE IN A CATV SYSTEM

The invention relates to a radio frequency signal distribution device for use in a distribution system for VHF and UHF signals which device comprises an input terminal, an output terminal and a signal transmission line connected between the input terminal and the output terminal, which signal transmission line is provided with a plurality of directional couplers which are connected in series for the RF signal on the signal transmission line, each directional coupler comprising a coupling loop as well as a tap-off terminal connected to the coupling loop which coupling loop has an electrical length of substantially one quarter of the wavelength of a frequency located in the TV UHF range.

Such a device is known from the Philips tap-off box LHC 0101.

In CATV systems it is desirable to divide the subscribers geographically into groups. Each group may comprise approximately 12 to 24 subscribers which are provided with signals from a checkpoint — the group centre mentioned below-through connecting lines. Such a so-called "mini-star-system" offers certain possibilities which can be realized in a simple manner in the group centre such as, for example, cutting-off non-paying subscribers, controlling the channel assortment per subscriber by means of band filters and the efficient isolation and elimination of disturbances.

The known tap-off box is provided with two substantially identical directional couplers which each couple a signal from the main signal i.e. the signal on the signal transmission line, and which feed it to a tap-off terminal. In order to supply 12 to 24 subscribers with signals the most obvious thing would be to connect 6 to 12 of these tap-off boxes in series in the group centres through the respective output terminals. However, in practice it appeared that signals obtained in this manner are unusuable.

For, as known the strongest signal-coupling occurs for signal frequencies the wavelength of which is equal or substantially equal to four times the electrical length of the coupling loop of the directional coupler. When the main signal passes a directional coupler the decrease in energy will therefore be much larger for these frequencies than for the other frequencies of the main signal. This causes the amplitude-frequency characteristic of the main signal to change so that a following directional coupler couples out a signal whose amplitude-frequency characteristic deviates from that of the signal which was coupled out by the preceding directional coupler.

With an arrangement, where a chain of directional couplers, are connected in series for the main signal, the amplitude-frequency characteristic of the signal coupled out from the first directional coupler in the chain will deviate very strongly from that of the last directional coupler in the chain. This deviation does not only relate to the total signal energy content per coupler but also to the energy distribution over the frequencies of the output signal of each coupler. Because the energy content of the signals coupled out decreases from the first to the last directional coupler the subscribers are generally connected in the sequence of distance to the directional couplers, on the understanding that the subscriber which is furthest from the group centre is connected to the first directional coupler and the subscriber which is nearest to the group centre is connected to the last directional coupler.

In practice frequency-dependent minimum and maximum limits are imposed on the strength of the signal which is made available for the subscriber. Furthermore, requirements are made as regards the signal level difference which may occur within given frequency bands, in other words with respect to the steepness of the amplitude-frequency characteristic of the signal within these frequency bands. Especially owing to these last mentioned requirements the number of taps which can be realized with a series arrangement of a plurality of the known tap-off boxes is limited very drastically. Furthermore, the range within which the cable length per tap may vary is diminished to such an extend due to this requirement that such a series arrangement of the known tap-off boxes cannot be used in a group centre of a mini-star system as mentioned hereinbefore.

It is an object of the invention to provide an signal distribution device with some dozens of taps and which can be used in a group centre of a mini-star system to supply from this group centre some dozens of subscribers which are generally located within a given radius of, for example, 80 to 100 m around the group centre, with a signal the level of which satisfies the above-mentioned requirements.

The signal distribution device according to the invention is therefore characterized in that the electrical length of the coupling loops increases in the direction from the input terminal to the output terminal and that in the signal transmission line an attenuation filter is included between the input terminal and the directional couplers, which attenuation filter has an attenuation, for the frequencies between the standard TV VHF and the standard TV UHF range which is larger than for frequencies within these standard TV frequency ranges.

An increase in the electrical length of the coupling loops towards the direction of decreasing energy of the main signal results in a more uniform energy of the coupled-out signals than would be the case if this length were the same for each directional coupler. However, this causes also the frequency at which the maximum signal coupling is produced to decrease from the first directional coupler towards the last directional coupler. By choosing the electrical length of the coupling loops such that this frequency is in the standard TV UHF range (for example in accordance with the CCIR standard) for each directional coupler it is prevented that the spread in the attentuation to which the coupled-out signals through the lines to the various subscribers are subjected becomes too large per unit of line length.

Although the measure of increasing the electric length of the coupling loops diminish the decrease in energy coupling from the first to the last tap off terminal a signal level difference at each individual tap off terminal may occur within given frequency bands in the, based on the CCIR standard, standard TV VHF and Standard TV UHF range which exceeds the relevant requirements. It is possible to correct the coupled out signals having such an impermissible steepness in the amplitude-frequency characteristic by attenuating the main signal before applying it to the chain of directional couplers by means of an attenuation filter, which, for the frequencies between the standard TV VHF range and the standard TV UHF range, in accordance with the CCIR standard, has an attenuation which is larger than for the frequencies within these standard TV ranges.

In the invention a signal distribution device is characterized in that the attenuation filter is provided with a series branch and a parallel branch, which series branch shunts a series arrangement of first and second substantially equal resistors, which series branch comprises a parallel circuit of a third resistor, a first capacitor and a first inductor, which parallel branch is connected to the common node of the first and the second resistor and which parallel branch comprises a series circuit of a fourth resistor, a second capacitor and a second induction.

If the value of the two series-connected resistors are chosen to be equal to the characteristic impedance of the signal transmission line then such an attenuation filter will be capable of attenuating the main signal which, as a rule, shows a substantially flat amplitude-frequency characteristic at certain values of the first resistor and the second resistor over a wide frequency range in the standard TV VHF and the standard TV UHF-range (CCIR standard) without causing signal reflections.

The signal distribution device is characterized in that the third resistor has a resistance value which may be one to six times as large as the resistance value of the fourth resistor.

With such resistance value ratios of the first resistor with respect to that of the second resistor the attenuation filter shows a noticeable attenuation also for the frequencies in the CCIR-standard TV UHF and the standard TV UHF range. Owing to this attenuation the main signal can be corrected in such a way, that the coupled-out signal has a flatter amplitude-frequency characteristic in said standard TV ranges than would be the case for an uncorrected main signal.

The steepness in the amplitude-frequency characteristic of the coupled-out signal is namely caused by the fact that the coupling is frequency-dependent as mentioned above, and is strongest for frequencies whose wavelength is four times as large as the electrical length of the coupling loop of the directional coupler. By attenuating the amplitude of the main signal for the frequencies at which the signal amplitude changes impermissibly fast with the frequency it is possible to adjust the relevant steepness to a desired value.

The invention is further characterized in that the third resistor of such an attenuation filter has a resistance twice as large as that of the fourth resistor.

When the subscribers are connected in a proper sequence to the tap-off terminals of the signal distribution device according to the invention, it has been found that the signals coupled out from the main signal which is attenuated by the preferred embodiment of the attenuation filter each have, after having been transported through lines of different length an amplitude-frequency characteristic which satisfies the steepness requirements imposed on them in practice.

Although this corrective action of the attenuation filter is obtained in practice with signals which are coupled out by means of directional couplers with a coupling loop length which increases in the down-stream direction of the main signal it will be evident that signals which are coupled out with directional couplers with a, for example, equal length of the coupling loop can also be corrected by means of such a, possibly matched, attenuation filter.

The signal distribution device according to the invention, is further characterized in that the electrical length of the coupling loops increases from the input terminal towards the output terminal by approximately two to three percent, beween each two succeeding coupling loops.

Especially a combination of such coupling loops with the attenuation filter according to the preferred embodiment described above has been found in practice — starting from a main signal supplied to the input of the device with amplitude levels which are substantially equal for all signal frequencies found herein — to result in coupled out signals which show, after transmission to the subscribers an amplitude-frequency characteristic which satisfies the before mentioned requirements with respect to the steepness in certain frequency ranges.

The invention will be further explained by way of example, with reference to the single FIGURE of the accompanying drawing.

The FIGURE shows a radio-frequency signal distribution device according to the invention. Herein the signal distribution device 1 comprises an input terminal 3, an output terminal 4, a signal transmission line 9 connected between these terminals, which signal transmission line includes an attenuation filter 2, connected to the terminal 3 and twelve directional couplers 5a to 5l which are connected in series herewith for the radio frequency signals.

The attenuation filter 2 comprises a series circuit of two equal resistors 13 and 14 which is included in the signal transmission line 9 and connected to the terminal 3. This series circuit is shunted by a signal series branch consisting of the parallel circuit of a resistor 10, capacitor 11 and an inductor 12. The common node between the resistors 13 and 14 is connected to chassis through a signal parallel branch consisting of the series arrangement of an inductor 15, a capacitor 16 and a resistor 17.

The common node of the resistor 14 and the parallel circuit of the resistor 10, capacitor 11 and the inductor 12 is connected to the directional couplers 5a to 5l respectively through the signal transmission line 9. These directional couplers 5a to 5l respectively are provided with the respective coupling loops 8a to 8l inclusive which are on the one hand connected to the respective tap-off terminals 6a to 6l inclusive and on the other hand to chassis through the respective terminating resistors 7a to 7l inclusive.

A terminating resistor can be connected to chassis by means of the output terminal 4.

The signals to be distributed are fed to the attenuation filter 2 via the terminal 3. This attenuation filter is a wide band device and has a maximum attenuation for signals having a frequency of 300 MHz. Herewith the attenuation filter is rated such that also signals in a wide frequency range around 300 MHz can be efficiently attenuated. This causes the amplitude-frequency characteristic of the incoming signal which is, as a rule, flat to be corrected in such a manner that acceptable signals can be coupled out by means of the directional couplers 5a to 5l inclusive. After transmissive to the subscriber, so after the various cable attenuations have been deducted, the coupled out signals must satisfy a number of practical requirements. These requirements may be, for example, be that for frequencies between 40 and 230 MHz VHF-band the signal level must be between 57.5 dB $\mu$V and 80 dB $\mu$V, the frequencies between 87.5 and 104 MHz (FM-band) excepted, where the signal levels must be between 54 dB $\mu$V and 74 dB $\mu$V. For frequencies between 470 MHz and 800 MHz (UHF band) the signal level limits may be, for example, 65 and 78 dB $\mu$V. Furthermore, it may hold for each received coupled-out signal at the subscriber that the signal level difference of the TV signal within the VHF frequency band shall not exceed 8 dB and shall not exceed 6 dB within the TV UHF frequency band.

By means of the correction of the attenuation filter on the radio-frequency signals to be distributed, called main signal hereinbefore, it is possible to obtain coupled-out signals by means of the directional couplers 5a to 5l inclusive which satisfy these requirements at the subscribers. The corrected main signal is thereafter fed through the transmission line 9 to the directional couplers 5a to 5l inclusive which are connected in series for the main signal.

To obtain a somewhat uniform signal energy for the various subscribers the subscribers are not only connected to the tap-off terminals in sequence of distance, namely the remotest subscriber to the first tap-off terminal 6a and, at a decreasing distance, the nearest subscriber to the last tap-off terminal 6l but the length of the coupling loop 5a to 5l inclusive increases with a substantially equal value.

Furthermore, the length of the coupling loops 8a to 8l inclusive are chosen such that for each directional coupler the frequency at which the signal coupling is strongest, is higher than approximately 470 MHz to compensate for the larger attenuation which occurs at such high frequencies during transmission to the subscribers with respect to the lower frequencies. In this manner the signal received by each subscriber remains as far as possible independent of the frequency.

In general, at the terminal 4a terminal resistor of the same resistance as the terminal resistors 7a to 7l inclusive will be connected to chassis to pass the main signal, after it has passed the directional couplers, to chassis free from reflection.

In a practical embodiment of such a signal distribution device the length of the coupling loops increased by two mm for each coupling loop, from coupling loop 8a which had a length of 61 mm to the coupling loop 8l which had a length of 85 mm.

The terminating resistors 7a to 7l inclusive were equal in resistances to the characteristic impedance of the lines which were connected to the terminals. The characteristic impedance in the particular arrangement was 75 Ohms.

The values of the components of the attenuation filter 2 in this arrangement had the following values:

| Resistor | Value | Capacitors | Value |
| --- | --- | --- | --- |
| 10 | 110 Ω | 11 | 3.9 pF |
| 13 | 75Ω | 16 | 10 pF |
| 14 | 75 Ω | | |

-continued

| Resistor | Value | Capacitors | Value |
| --- | --- | --- | --- |
| 17 | 51 Ω | | |

The inductor 12 was constituted by a winding of 5.5 turns of copper wire having a diameter of 0.5 mm around a cylindrical core having a diameter of 3 mm and the inductor 15 were constituted by a winding of 2.5 turns of copper wire of also 0.5 mm diameter around a 3 mm diameter cylindrical core.

Measurements made upon this attenuation filter showed it to have a maximum attenuation of 8 db for signals having a frequency of 300 MHz.

What is claimed is:

1. A radio frequency-signal distribution device for use in a distribution system for VHF and UHF signals, which device comprises an input terminal, an output terminal and a signal transmission line connected between the input terminal and the output terminal, which signal transmission line comprises a plurality of directional couplers connected in series for the radio frequency signal on the signal transmission line, each directional coupler comprising a coupling loop and a tap-off terminal connected to the coupling loop, which coupling loop has an electrical length of a quarter of the wavelength of a frequency in the standard TV UHF range, the electrical length of the coupling loops increasing in the direction from the input terminal towards the output terminal, and an attenuation filter included in the signal transmission line between the input terminal and the directional couplers, which attenuation filter has an attenuation for the frequencies between the standard TV VHF and the standard TV UHF range which is larger than the attenuation for the frequencies in these standard TV frequency ranges.

2. A signal distribution device as claimed in claim 1, wherein the attenuation filter comprises a series branch and a parallel branch, which series branch shunts a series arrangement of first and second substantially equal resistors, which series branch comprises a parallel circuit of a third resistor, a first capacitor and a first inductor, which parallel branch is connected to the common node of the first and the second resistor and comprises a series circuit of a fourth resistor, a second capacitor and a second inductor.

3. A signal distribution device as claimed in claim 2, wherein the third resistor has a resistance value which is one to six times as large as the resistance of the fourth resistor.

4. A signal distribution device as claimed in claim 1 wherein the electrical length of the coupling loops increases by approximately two to three percent between each two succeeding coupling loops from the input terminal towards the output terminal.

* * * * *